United States Patent
Xia et al.

(10) Patent No.: US 9,951,989 B2
(45) Date of Patent: Apr. 24, 2018

(54) REFRIGERATOR

(71) Applicant: BSH HAUSGERAETE GMBH, Munich (DE)

(72) Inventors: Bicong Xia, Nanjing (CN); Chuan Zhang, Chuzhou (CN); Nanwei Zhang, Nanjing (CN)

(73) Assignee: BSH Hausgeraete GmbH, Munich (DE)

(*) Notice: Subject to any disclaimer, the term of this patent is extended or adjusted under 35 U.S.C. 154(b) by 0 days.

(21) Appl. No.: 15/598,423

(22) Filed: May 18, 2017

(65) Prior Publication Data

US 2017/0350643 A1   Dec. 7, 2017

(30) Foreign Application Priority Data

Jun. 3, 2016  (CN) .......................... 2016 1 0388569

(51) Int. Cl.
| | | |
|---|---|---|
| *F25D 23/02* | (2006.01) | |
| *F25D 29/00* | (2006.01) | |
| *F25D 11/00* | (2006.01) | |
| *F25D 23/12* | (2006.01) | |

(52) U.S. Cl.
CPC ............ *F25D 29/005* (2013.01); *F25D 11/00* (2013.01); *F25D 23/028* (2013.01); *F25D 23/12* (2013.01); *F25D 2323/024* (2013.01); *F25D 2700/02* (2013.01)

(58) Field of Classification Search
CPC .... F25D 23/02; F25D 23/028; F25D 2323/02; F25D 2323/04; F25D 2500/06; F25D 2700/02

See application file for complete search history.

(56) References Cited

U.S. PATENT DOCUMENTS

| | | | | |
|---|---|---|---|---|
| 2005/0029080 | A1* | 2/2005 | Rupp | .................... F25D 29/008 |
| | | | | 200/61.62 |
| 2008/0083243 | A1* | 4/2008 | Lee | ........................ F25D 23/028 |
| | | | | 62/446 |
| 2009/0231132 | A1* | 9/2009 | Shoenfeld | ........... E05B 47/0012 |
| | | | | 340/542 |
| 2014/0293060 | A1* | 10/2014 | Ryu | ..................... H04N 5/2252 |
| | | | | 348/159 |
| 2016/0033194 | A1* | 2/2016 | Sumihiro | ................ F25D 23/04 |
| | | | | 62/125 |
| 2017/0122654 | A1* | 5/2017 | Lee | ..................... A47B 88/0414 |
| 2017/0321960 | A1* | 11/2017 | Favila | ................... F25D 29/008 |

* cited by examiner

*Primary Examiner* — Daniel J Rohrhoff
(74) *Attorney, Agent, or Firm* — Laurence A. Greenberg; Werner H. Stemer; Ralph E. Locher

(57) ABSTRACT

A refrigerator includes a cabinet, a door and a hinge assembly connecting the door and the cabinet. A sensor detects an opening angle of the door. The sensor includes: a first component and a second component, where one of the first component and the second component is a magnetic element, and the other one is a magnetic sensing element. The first component is provided at the hinge assembly, and the second component is provided at the door. This enables the magnetic sensing element to accurately sense a magnetic field of the magnetic element, and simplify a structure of the cabinet.

13 Claims, 7 Drawing Sheets

REFRIGERATOR

CROSS-REFERENCE TO RELATED APPLICATION

This application claims the priority, under 35 U.S.C. § 119, of Chinese patent application CN 201610388569.9, filed Jun. 3, 2016; the prior application is herewith incorporated by reference in its entirety.

BACKGROUND OF THE INVENTION

Field of the Invention

The present invention relates to a refrigerator.

Refrigerators are necessary household appliances in modern home life. Some of the functions in a modern refrigerator, need to use an opening angle of a door as a response element, such as an illumination device in a storage chamber. When the door is opened by an given angle, the illumination device may be triggered to be turned on, and when the door is closed to an angle, the illumination device may be triggered to be turned off. For example, regarding a camera device for capturing a food condition in the storage chamber, when the door is opened to a predetermined angle, the camera device may be triggered to execute an image capturing action.

In order to detect an opening angle of the door, the refrigerator is provided with a sensor for detecting the opening angle of the door, and transmitting an opening signal of the door to a response device, such as the illumination device or the camera device. Moreover, a layout position and a fixing manner of the sensor would affect, in one aspect, a sensing accuracy of the sensor; and in another aspect, would also directly affect wiring difficulty between the sensor and the response device, so as to affect a structure of the refrigerator.

SUMMARY OF THE INVENTION

It is accordingly an object of the invention to provide a refrigerator which overcomes various disadvantages of the heretofore-known devices and methods of this general type and thus resolves at least one of the foregoing problems.

With the foregoing and other objects in view there is provided, in accordance with the invention, a refrigerator, comprising:

a cabinet, a door and a hinge assembly connecting the door to the cabinet to enable the door to be opened to an opening angle between the cabinet and the door; and a sensor configured to detect the opening angle of the door, the sensor including a first component mounted to the hinge assembly and a second component mounted to the door, wherein one of the first and second components is a magnetic element and the other of the first and second components is a magnetic sensing element.

In other words, the objects of the invention are achieved by the novel refrigerator. The refrigerator includes a cabinet, a door, a hinge assembly configured to connect the door and the cabinet, and a sensor configured to detect an opening angle of the door. The sensor includes: a first component and a second component, where one of the first component and the second component is a magnetic element, and the other one is a magnetic sensing element. The first component is provided at the hinge assembly, and the second component is provided at the door.

Compared with the prior art, the technical solution of the present invention provides at least for the following advantages:

In the present invention, the sensor is provided at a position of the hinge assembly, the first component of the sensor is provided in the hinge assembly, and the second component is provided in the door. Such configuration has the following advantages. In one aspect, a distance between the magnetic element and the magnetic sensing element is close, and the magnetic sensing element may accurately sense a magnetic field of the magnetic element, thereby preventing a failed sensing because the distance between the magnetic element and the magnetic sensing element is too large, and ensuring reliability of work of the sensor. In another aspect, the first component is provided at the hinge assembly. However, when provided on the non-cabinet, with respect to the cabinet, installation and fixing of the first component need not to be considered, thereby simplifying a structure of the cabinet.

In accordance with an added feature of the invention, the hinge assembly includes a hinge cover fixed to the cabinet, and the first component is provided at the hinge cover.

In accordance with an additional feature of the invention, the first component is located at an end of the hinge cover away from the cabinet (i.e., distal end), so as to be close to the second component.

In accordance with a further feature of the invention, the hinge cover includes a base wall that extends substantially parallel to a top surface of the door and a flange connected to the base wall. The first component is thereby fixed to the hinge cover along the flange.

In accordance with another feature of the invention, the hinge cover further includes an installation groove provided along the flange. The first component is fixed in the installation groove.

In accordance with yet an added feature of the invention, the first component is co-injection-molded with the hinge cover. After the co-injection-molding is completed, the first component may be firmly fixed in the hinge cover. Due to the co-injection molding, problems about fixing the first component in the hinge cover may be well resolved, and the fixing is reliable, without needing an additional installation, thereby saving an assembly process and cost.

In accordance with yet an additional feature of the invention, one end of the door in a height direction has a side cover; a top portion of the side cover is provided with a recess and a cover member. The cover member is configured to close the recess. The second component is located in the recess.

In accordance with yet a further feature of the invention, the second component is fixed to the cover member. When assembling, the second component is installed to the cover member, and then the cover member is provided at the recess, facilitating the installation.

In accordance with an added feature of the invention, an inner side of the cover member is provided with a positioning portion through which the second component is fixed.

In accordance with an additional feature of the invention, the refrigerator further includes a controller which is fixed to the door, where the magnetic sensing element is electrically connected to the controller. The magnetic sensing element sends an opening signal of the door to the controller, and the controller generates a control instruction according to the opening signal.

In accordance with yet an added feature of the invention, the second component is the magnetic sensing element.

In accordance with yet another feature of the invention, the door is provided with an installation pocket configured to accommodate the controller, the installation pocket is in communication with the recess for a cable to pass therethrough, and the cable is configured to electrically connect the controller with the magnetic sensing element.

In accordance with a concomitant feature of the invention, the refrigerator further includes a camera device fixed to the door, and a controller fixed to the door. The magnetic sensing element is located at the door and is configured to issue a door opening angle signal about a detected opening angle of the door. The controller controls an action of the camera device according to the door opening angle signal.

Other features which are considered as characteristic for the invention are set forth in the appended claims.

Although the invention is illustrated and described herein as embodied in a refrigerator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
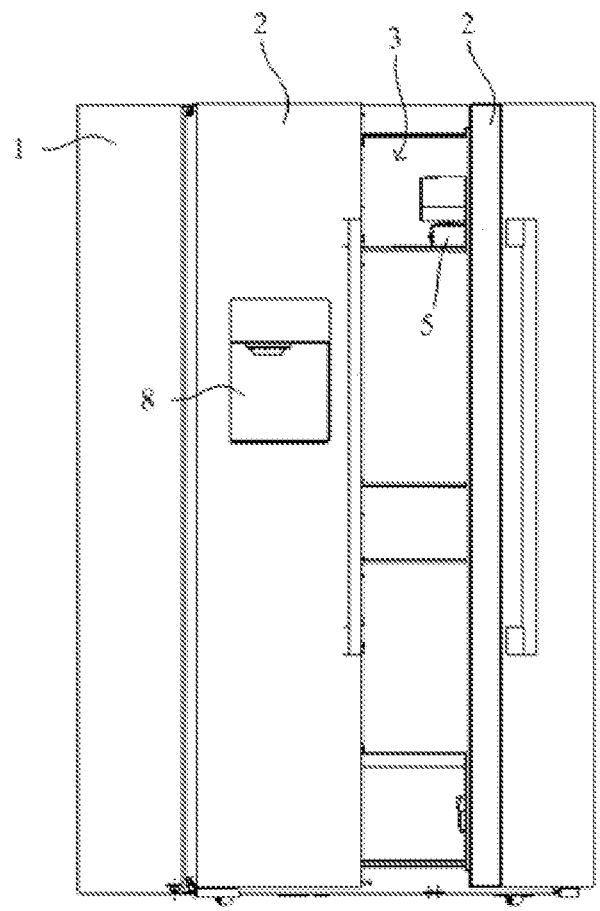
FIG. 1 is a frontal view of a refrigerator according to an embodiment of the present invention.
Figure 2:
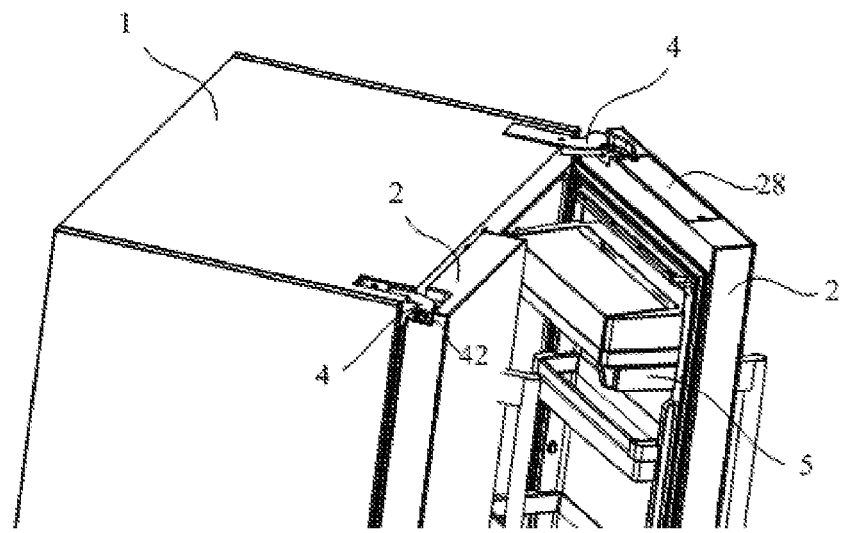
FIG. 2 is a partial structural diagram of a refrigerator with a door opened according to an embodiment of the present invention.

Referring now to the figures of the drawing in detail and first, particularly, to FIGS. 1 and 2 thereof, there is shown an exemplary embodiment of a refrigerator according to the present invention. The refrigerator includes a cabinet 1 and a door 2, where a storage chamber 3 is provided within the cabinet 1, and the door 2 is configured to open or close the storage chamber 3. The door 2 is connected, at a side along a width direction of the refrigerator, to the cabinet 1 by using a hinge assembly 4, and may rotate with respect to the cabinet 1, so as to complete an action of opening or closing.

The number of the door of the refrigerator is not limited in this embodiment, and a storage chamber may be closed by one or more doors. The refrigerator shown in FIGS. 1 and 2 is a side-by-side refrigerator, and the same storage chamber may be closed by two doors.

As shown in FIGS. 1 and 2, the refrigerator is also provided with a camera device 5, so as to capture a food storage condition within the storage chamber 3.

Figure 3:
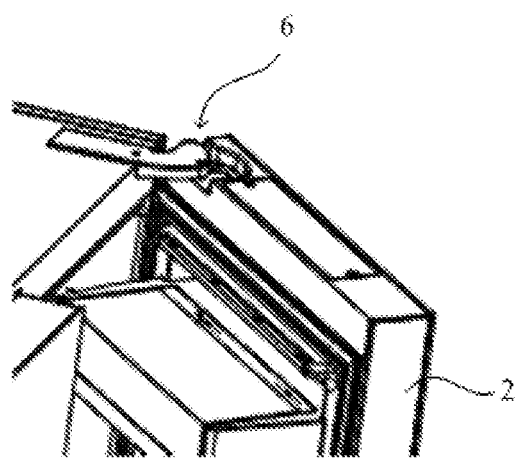
FIG. 3 is an enlarged structure of a hinge assembly of a refrigerator in FIG. 2 according to an embodiment of the present invention.
Figure 4:
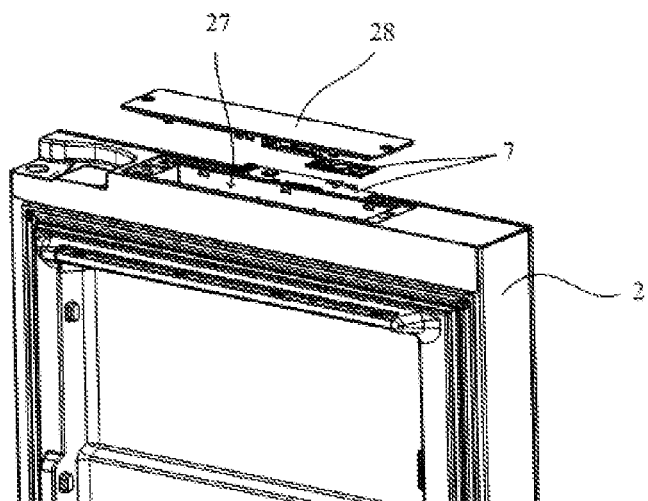
FIG. 4 is an exploded view of that a door of a refrigerator is at a position of a controller according to an embodiment of the present invention.

With reference to FIGS. 3 and 4, the refrigerator is further provided with a sensor 6 and a controller 7 which are configured to cooperate with the camera device 5. The sensor 6 is configured to detect an opening angle of the door 2; the controller 7 is configured to send a control instruction according to an opening signal of the door 2 which is detected by the sensor 6; and the camera device 5 performs an image capturing action according to the control instruction of the controller 7.

The sensor 6 and the controller 7 may communicate in a wired or wireless manner, and the controller 7 and the camera device 5 may also communicate in a wired or wireless manner, so as to implement data or signal transmission.

Fixed structures of the sensor 6, the controller 7, and the camera device 5 are introduced below.

The Fixed Structure of the Sensor 6

Figure 5:
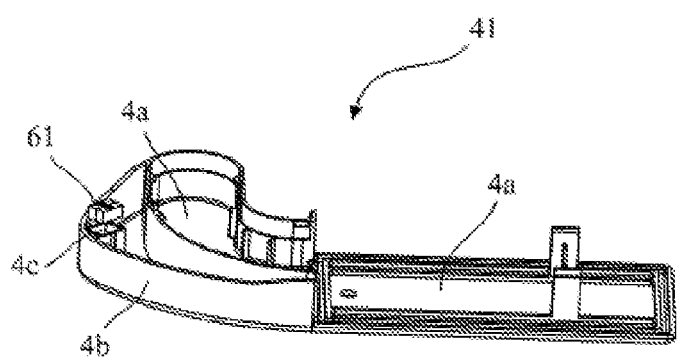
FIG. 5 is a stereoscopic structural diagram of a hinge cover of a refrigerator according to an embodiment of the present invention.
Figure 6:
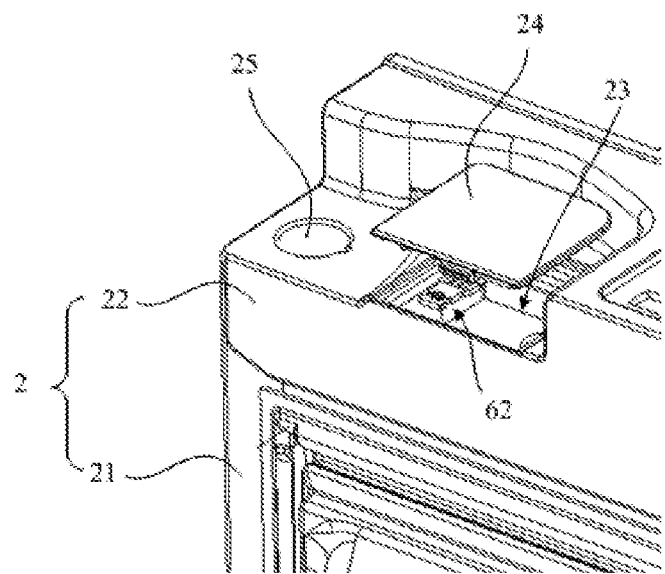
FIG. 6 is a structural diagram of that a door of a refrigerator is at a position of a recess according to an embodiment of the present invention.
Figure 7:
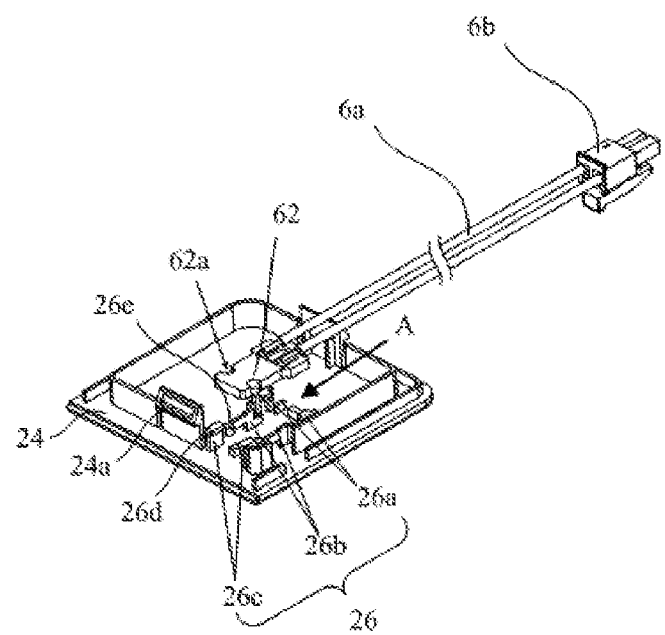
FIG. 7 is a stereoscopic exploded view of a first cover member and a second component of a refrigerator according to an embodiment of the present invention.

With reference to FIGS. 5-7, the sensor 6 includes: a first component 61 (FIG. 5 and FIG. 7) and a second component 62 (FIG. 6), where one of the first and second components 61, 62 is a magnetic element, and the other one is a magnetic sensing element. The magnetic sensing element is configured to sense a magnetic field of the magnetic element, and to determine a rotational angle of the door 2 according to a change of a sensed magnetic field, so as to obtain an opening position of the door 2, and generate the opening signal.

The first component 61 is provided at a hinge assembly 4, and the second component 62 is provided at the door 2. In this embodiment, the first component 61 is a magnetic element, such as a magnet; and the second component 62 is a magnetic sensing element, such as a magnetic sensor, thereby facilitating wiring.

In view of the above, in this embodiment, the sensor is provided at a position of a hinge assembly 4 of the door 2, the first component 61 of the sensor is provided within the hinge assembly 4, and the second component 62 is provided within the door 2. Such configuration has the following advantages. In one aspect, a distance between the magnetic element and the magnetic sensing element is close, and the magnetic sensing element may accurately sense a magnetic field of the magnetic element, thereby preventing a failed sensing because the distance between the magnetic element and the magnetic sensing element is too great, and ensuring functional reliability of the sensor. In another aspect, the first component 61 is provided at the hinge assembly 4. However, when provided on the non-cabinet 1, with respect to the cabinet 1, installation and fixing of the first component 61 need not to be considered, thereby simplifying a structure of the cabinet 1.

In other embodiments, if a wiring solution allows, or wireless communication is used between the magnetic sensing component and the controller 7, the first component 61 may also be provided as a magnetic sensing component, and the second component 62 is then provided as a magnetic element.

Specifically, with reference to FIG. 2 and FIG. 5, the hinge assembly 4 includes a hinge cover 41 fixed to the cabinet 1, and a rotating shaft 42 fixed to the door 2 (FIG. 2), where one end of the hinge cover 41 is fixed on the cabinet 1, and the other end is fixed on the rotating shaft 42. The first component 61 is provided on the hinge cover 41, and is located at an end of the hinge cover 41 which is away from the cabinet 1, i.e., located at an end close to the rotating shaft 42, so as to be close to the door 2, thereby being close to the second component 62.

As shown in FIG. 5, the hinge cover 41 includes: a base wall 4a substantially parallel to a top surface of the door 2, and a flange 4b connected to the base wall 4a, where the first component 61 is fixed to the hinge cover 41 along the flange 4b. The top surface of the door 2 refers to a surface parallel to an upper surface of the refrigerator.

Specifically, the hinge cover 41 further includes an installation groove 4c provided along the flange 4b, where the first component 61 is fixed in the installation groove 4c. In this embodiment, the installation groove 4c uses the base wall 4a as a bottom wall, and the flange 4b serves as a part of a side wall of the installation groove 4c. In other embodiments, the installation groove 4c may also be provided independently from the base wall 4a and the flange 4b.

In some embodiments, the first component 61 may be engaged in the installation groove 4c by using an engagement portion, may also be pressed in the installation groove 4c through an interference fit, or is fixed in the installation groove 4c through another manner or fixed structure.

In this embodiment, the first component 61 and the hinge cover 41 are co-injection-molded. That is, during an injection molding process of the hinge cover 41, the first component 61 is placed in an injection mould to be injected. After the injection is completed, the first component 61 may be firmly fixed in the hinge cover 41.

Due to the co-injection, any problems relating to fixing the first component 61 in the hinge cover 41 may be resolved. That is, the fixing is reliable, without needing an additional installation, thereby saving a process and cost.

The second component 62 is provided on the door 2. Theoretically, in a case allowed by a sensing distance, the second component 62 may be provided at any position of the door 2. In this embodiment, the second component 62 is provide at a side of the door 2 which faces the hinge cover 41, and the hinge cover 41 is not provided with the first component 61. Moreover, the second component 62 serving as the magnetic sensing element is located at an end of the door 2 which is close to the rotating shaft 42. In this way, the magnetic element and the magnetic sensing element are adjacent.

Specifically, as shown in FIG. 6, the door 2 includes a door sheet 21 and a side cover 22, where the side cover 22 is located at an end of the door 2 which is at a height direction, and is connected to the door sheet 21. At the height direction, the side cover 22 may be located at a top portion or a bottom portion of the door 2. The height direction herein refers to a height direction of the refrigerator.

As stated above, the second component 62 is provided at a side of the door 2 which faces the hinge cover 41. If the first component 61 is provided in the hinge cover 41 located at the top portion of the door 2, the second component 62 may be provided in the side cover 22 located at the top portion of the door 2. If the first component 61 is provided in the hinge cover 41 located at the bottom portion of the door 2, the second component 62 may be provided in the side cover 22 located at the bottom portion of the door 2. In this embodiment, both the first component 61 and the second component 62 are located at the top portion of the door 2.

As shown in FIG. 6, with respect to the side cover 22 provided with the second component 62, the top portion of the side cover 22 is provided with a recess 23, and a cover member which is defined as a first cover member 24, where the first cover member 24 is configured to close the recess 23. The side cover 22 is provided with a hinge hole 25 for the rotating shaft 42 to pass through, and the recess 23 is provided at an end of the door 2 which is close to the hinge hole 25, thereby being adjacent to the hinge hole 25.

The second component 62 is located in the recess 23 and is fixed in the recess 23, for example, may be fixed on a side wall or a bottom wall of the recess 23.

In this embodiment, as shown in FIG. 7, the second component 62 is fixed to the first cover member 24. When assembling, the second component 62 is first fixed to the first cover member 24, and then the first cover member 24 is covered at the recess 23. The operation is simple and convenient.

Specifically, an inner side of the first cover member 24 (a side facing the recess 23) is provided with a positioning portion which is defined as a first positioning portion 26, where the second component 62 is fixed by using the first positioning portion 26. This embodiment does not limit a structure of the first positioning portion 26, as long as the second component 62 may be fixed on the first cover member 24, where a detachable fixing manner such as engagement or a non-detachable fixing manner may be used.

With reference to FIG. 7, the first positioning portion 26 is fixed to an inner surface of the first cover member 24 which faces the recess 23, and there are two sets of first positioning portions 26 which are located at two sides of the second component 62, respectively. A channel for the second component 62 to pass through is formed between the first positioning portions 26 at the two sides. The second component 62 passes through a passage along a direction parallel to the inner surface of the first cover member 24, and is fixed in the first positioning portion 26. A penetration direction is as shown by direction A of FIG. 7.

Along the penetration direction A of the second component 62, the first positioning portion 26 includes a first positioning block 26a, a second positioning block 26b, and a third positioning block 26c which are successively arranged.

At least the first positioning block 26a and the third positioning block 26c are provided with a first locking protrude portion 26d at an free end, configured to abut against a side of the second component 62 which faces away from the first cover member 24, so as to lock the second component 62 at a depth direction of the recess 23, i.e., the height direction of the door.

The second positioning block 26b is connected with an elastic strip at a front end along the penetration direction A of the second component 62, where the elastic strip is also provided with a second locking protrude portion 26e. The second locking protrude portion 26e is configured to lock the second component 62 at two sides of the penetration direction A. Specifically, the second component 62 includes a side surface located at the two sides of the penetration direction A, where the side surface is provided with a recess portion 62a corresponding to the second locking protrude portion 26e. After the assembling is completed, the second locking protrude portion 26e on the second positioning block 26b is engaged in the recess portion 62a.

In some other embodiments, positions of the first locking protrude portion 26d and the second locking protrude portion 26e are not limited, and the first locking protrude portion 26d and the second locking protrude portion 26e may be located at any one or more of the first positioning block 26a, the second positioning block 26b, and the third positioning block 26c. In addition, number of the positioning blocks in the first positioning portion 26 may also be adjusted, for example, the number may be one, two, or another number.

Again with reference to FIG. 7, along the penetration direction A, a width of a back half part of the second component 62 is greater than a width of a front half part, where a shaft shoulder is formed between the two parts, and the first positioning block 26a abuts against the shaft shoulder, so as to lock the second component 62 at the penetration direction A, thereby preventing the second component 62 from passing out.

The second component 62 may be separated from the inner surface of the first cover member 24 by using a spacer.

In addition, in order to implement the fixing between the first cover member 24 and the recess 23, one of the first cover member 24 and the recess 23 is provided with a buckle, and the other one is provided with a hook cooperating with the buckle, where the buckle is engaged in the hook. In this embodiment, as shown in FIG. 7, the first cover member 24 is provided with a hook 24a at the inner surface (only a part is marked in the figure), and the buckle is provided in the recess 23.

As shown in FIG. 7, in this embodiment, the second component 62 and the controller 7 are connected by using a cable 6a. The cable 6a is connected with a connector 6b at an end distal from the second component 62, and is connected to the controller 7 by way of the connector 6b.

The Fixed Structure of the Controller 7

Theoretically, the controller 7 may be fixed to any position of the cabinet 1 or the door 2. In this embodiment, the controller 7 is fixed on the door 2, and is located on the side cover 22 of the door 2, for example, on a side cover at the top portion of the door or a side cover at the bottom portion of the door.

Preferably, the controller 7 and the second component 62 of the sensor 6 are located on the same side cover 22, thereby facilitating the wiring, and reducing a communication transmission distance.

As shown in FIG. 4, the side cover is provided with an installation pocket 27 or recess 27 facing away from an opening at a side of the door sheet 2, and a cover member configured to close the opening, where the cover member is defined as a second cover member 28, and the controller 7 is located in the installation pocket 27.

The controller 7 may be fixed in the installation pocket 27, for example, be fixed on an inner wall of the installation pocket 27, or the controller 7 may also be fixed to an inner side of the second cover member 28.

In this embodiment, the fixing of the controller 7 uses the latter manner. That is, the controller 7 is fixed to the inner side of the second cover member 28. When assembling, the controller 7 is first fixed to the second cover member 28, and then the second cover member 28 is covered at the installation pocket 27. The operation is simple and convenient.

An outer side of the second cover member 28 forms a part of an outer surface of the door 2. As shown in FIG. 2, the second cover member 28 flushes with a surface of the top portion of the door 2.

Figure 8:
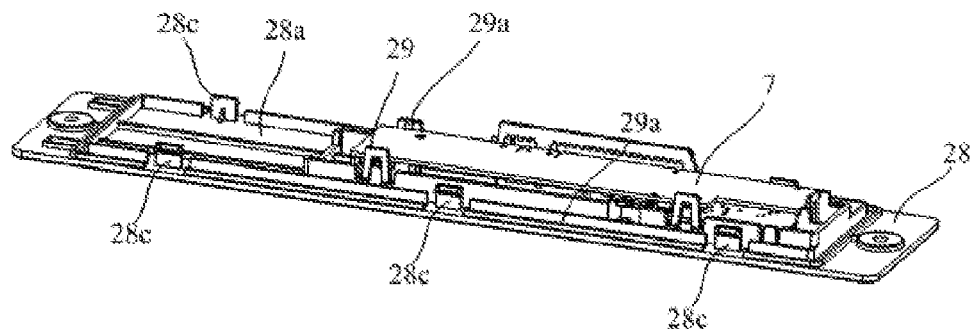
FIG. 8 is a structural diagram of a second cover member and a controller of a refrigerator according to an embodiment of the present invention.
Figure 9:
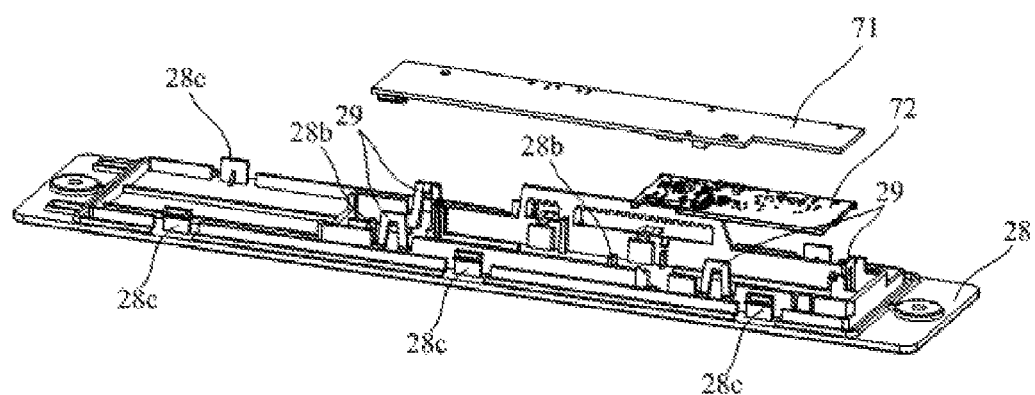
FIG. 9 is an exploded view of a second cover member and a controller of a refrigerator according to an embodiment of the present invention.

Further, as shown in FIG. 8 and FIG. 9, the inner side of the second cover member 28 is provided with a positioning portion which is defined as second positioning portion 29, where the controller 7 is fixed to the second cover member 28 by using the second positioning portion 29. This embodiment does not limit a structure of the second positioning portion 29, as long as the controller 7 may be fixed on the second cover member 28, where a detachable fixing manner such as engagement or a non-detachable fixing manner may be used.

It can be seen from FIG. 8 and FIG. 9 that the controller 7 is plate-like, and a pate surface thereof is parallel to the second cover member 28.

As shown in FIG. 8 and FIG. 9, the second cover member 28 includes an inner surface 28a facing the installation pocket 27, and one end of the second positioning portion 29 is fixed to the inner surface 28a, and extends towards the controller 7. A free end of the second positioning portion 29 is provided with a hook 29a, so as to be hooked at a side of the controller 7 which faces away from the inner surface 28a.

There are a plurality of second positioning portions 29 which are located at two side of the controller 7 which are along a width direction of the door 2, respectively.

The second positioning portions 29 may be elastic pieces. Along the width direction of the door 2, a distance from the second positioning portion 29 located at a side of the controller 7 to the second positioning portion 29 located at another side of the controller 7 is smaller than width of a corresponding position of the controller 7. When installing, the controller 7 is pressed in along a direction vertical to the inner surface 28a, so as to force the second positioning portion 29 to generate an elastic deformation outwards. After the controller 7 is totally pressed in, the hook 29a is hooked on the controller 7.

In addition, an end portion of the controller 7 which is along the width direction may also be provided with the second positioning portion 29, so as to lock the controller 7 at the end portion.

In this embodiment, a spacer 28b is provided between the inner surface 28a and the controller 7. FIG. 9 only shows a part of the spacer 28b, and a side of the controller 7 which faces the inner surface 28a abuts against the spacer 28b. The spacer 28b provides a gap between the controller 7 and the inner surface 28a.

In addition, in order to implement the fixing between the second cover member 28 and the installation pocket 27, one of the second cover member 28 and the installation pocket 27 is provided with a buckle, and the other one is provided with a hook cooperating with the buckle, where the buckle is engaged in the hook. In this embodiment, as shown in FIG. 8 and FIG. 9, the second cover member 28 is provided with a hook 28c at the inner surface 28a (only a part is marked in the figure), and the buckle is provided in the installation pocket 27.

A person skilled in the art knows that the door sheet 21 includes a front door sheet and a rear door sheet, where a foaming material foamed by a foaming liquid is filled between the front door sheet and the rear door sheet. The controller 7 and the foaming material need not to be separated, so as to prevent the foaming liquid from immersing the controller 7 during a foaming process.

Therefore, in some embodiments, the installation pocket 27 is provided to be a bland hole. That is, at a height direction, the installation pocket 27 is provided with an opening only at a side facing away from the door sheet 21, and is closed at the other side. Along a front-back direction of the refrigerator, the installation pocket 27 is staggered from the storage chamber 3. The storage chamber 3 herein mainly refers to a storage chamber corresponding to a door provided with the installation pocket 27. In this embodiment, the installation pocket 27 is located in the side cover 22 at an upper portion of the door, and extends along the height direction of the refrigerator. In this way, a bottom portion of the installation pocket 27 needs to be located above the corresponding storage chamber.

In order to ensure installation of a controller 7, depth of the installation pocket 27 should be slightly greater than thickness of the controller 7. On this basis, the depth of the installation pocket 27 should be smaller as possible, so as to prevent the installation pocket 27 and the storage chamber 3 from overlapping along the front-back direction of the refrigerator. If the bottom portion of the installation pocket 27 is lower than an edge of the storage chamber 3, and the installation pocket 27 and the storage chamber 3 overlap along the front-back direction of the refrigerator, thickness of an isolation material of the door at a position of the installation pocket 27 is small and isolation effect is weak. As a result, a dewing phenomenon occurs to a portion of the door at the installation pocket 27, thereby affecting cooling effects of the refrigerator.

In some other embodiments, the installation pocket 27 may also be provided as a through hole. That is, at the height direction, two ends of the installation pocket 27 are both opened. In this case, in order to make sure that the controller 7 is not immersed by the foaming liquid, the controller 7 needs to be performed with a water-proof or closing processing.

The installation pocket 27 and the recess 23 are communicated for the cable 6a to pass through, where the cable 6a is configured to electrically connect the controller 7 and the magnetic sensing component.

As shown in FIG. 9, the controller 7 includes a first printed circuit board 71 and a second printed circuit board 72.

One of the first printed circuit board 71 and the second printed circuit board 72 is configured to receive the opening signal of the door 2 so as to control the camera device 5, and the other one is configured to transmit the image/video captured by the camera device 5 to a remote server. The remote server may be a cloud end, or a user terminal communication device such as a telephone or a tablet computer.

In this embodiment, the first printed circuit board 71 and the second printed circuit board 72 are inserted into each other by using a connector (not shown in the figure), so as to achieve a communication connection. In order save space, the first printed circuit board 71 and the second printed circuit board 72 are overlapped.

As shown in FIG. 9, the second printed circuit board 72 is located between the first printed circuit board 71 and the second cover member 28, and a volume of the first printed circuit board 71 is greater than the second printed circuit board 72. The first printed circuit board 71 is provided with a power source for supplying power to power-consuming components on the camera device 5, the second component 62, and the controller 7.

Meanwhile, the controller 7 communicates with the camera device 5 by using the first printed circuit board 71, and communicates with the second component 62 in the sensor by using the second printed circuit board 72.

Specifically, the second printed circuit board 72 receives the opening signal of the door 2 which is detected by the sensor 6, and sends a control instruction to the camera device 5 according to the opening signal; and the camera device 5 performs an image capturing action according to the control instruction.

After the camera device 5 finishes the image capturing, a captured image or video may be sent. The first printed circuit board 71 is configured to receive the image or video sent by the camera device, and then send a received image and video to the remote server.

A wireless communication module (not shown in the figure) is provided at the controller 7, and the wireless communication module is configured to communicate with the remote server.

In other embodiments, functions of the first printed circuit board 71 and the second printed circuit board 72 may be exchanged. That is, the communication with the camera device 5 may be implemented by using the second printed circuit board 72, and the communication with the second component 62 in the sensor may be implemented by using the first printed circuit board 71.

As shown in FIG. 1, the refrigerator is further provided with the user interface unit 8 which includes: at least one of an input unit and an output unit. The input unit is configured to receive user input, and the output unit is configured to output information to a user. The controller 7 is electrically connected to the input unit and the output unit, so as to process input information of the user and control the output information of the output unit.

The Fixed Structure of the Camera Device

Figure 10:
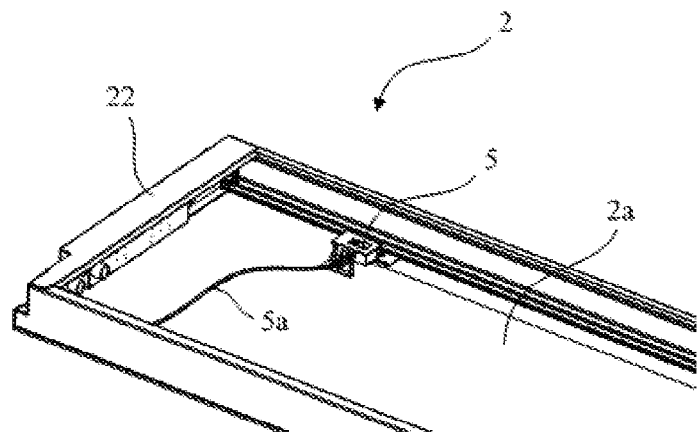
FIG. 10 is a stereoscopic structural diagram of that a camera device of a refrigerator is installed on a door according to an embodiment of the present invention.

With reference to FIGS. 1 and 2 and in combination with FIG. 10, the camera device 5 is fixed to the door 2, and the controller 7 is electrically connected to the camera device 5 by using a cable 5a.

As stated above, the camera device 5 is configured to receive the control instruction of the controller 7, and perform an image capturing action according to the control instruction.

The camera device 5 is provided with an output module, configured to output a captured image to the controller 7.

Figure 11:
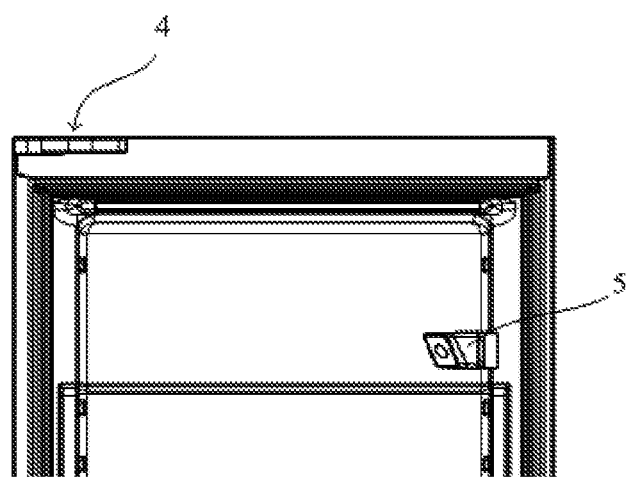
FIG. 11 is a structural front view of that a camera device of a refrigerator is installed on a door according to an embodiment of the present invention.

As stated above, the door 2 is a hinge door 2. In order to have a better image-capturing angle, as shown in FIG. 11, in this embodiment, the camera device 5 is installed at side of door 2 which is away from the hinge assembly 4, and is located at an upper half of the door 2.

While being used, the sensor 6 detects an opening angle of the door 2. When the detected opening angle of the door 2 is substantially 45 degrees, the controller 7 sends a control signal to the camera device 5, so as to control the camera device 5 to perform the image capturing action. At this time, an entire space of the storage chamber 3 may substantially fall within an image-capturing field of the camera device 5, so as to implement image capturing of the camera device 5 for the food storage condition within the entire storage chamber 3.

Figure 12:
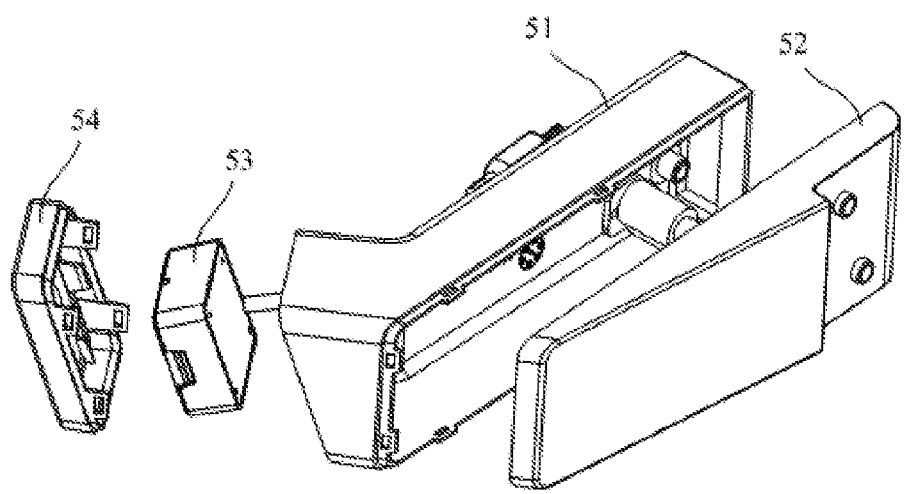
FIG. 12 is a stereoscopic exploded view of a camera device of a refrigerator according to an embodiment of the present invention.

As shown in FIG. 12, the camera device 5 includes a first housing 51 and a second housing 52, where the first housing 51 and the second housing 52 enclose to form an accommodation chamber for accommodating a camera 53. The accommodation chamber is provided with an opening at an end, and a lens of the camera 53 faces the opening. The opening is closed by using a transparent lens cap 54. A cable connected to the camera 53 passes out from the accommodation chamber, and then is connected to the controller 7.

The first housing 51 and the second housing 52 are provided with fixing holes 55 at an end far away from the lens cap 54 for a fixing bolt (not shown in the figure) to pass through. The camera device 5 is fixed on the door 2 by using the fixing bolt.

It should be noted that in this embodiment, the sensor 6 may be configured to connect another device, so as to transmit an opening signal of the door thereto. The controller 7 may also be configured to connect another device, such as a control panel, so as to control the same to work.

Although the present invention discloses the above, but the present invention is not limited thereto. Any person skilled in the art may make various variations and modifications without departing from the scope and spirit of the present invention. Therefore, the protection scope of the present invention should fall within the scope defined by the claims.

The invention claimed is:

1. A refrigerator, comprising:
    a cabinet;
    a door;
    a hinge assembly connecting said door to said cabinet to enable said door to be opened to an opening angle between said cabinet and said door; and
    a sensor configured to detect the opening angle of said door, said sensor including a first component mounted to said hinge assembly and a second component mounted to said door, wherein one of said first and second components is a magnetic element and the other of said first and second components is a magnetic sensing element.

2. The refrigerator according to claim 1, wherein said hinge assembly comprises a hinge cover fixed to said cabinet, and said first component is disposed at said hinge cover.

3. The refrigerator according to claim 2, wherein said hinge cover has an end distal from said cabinet and said first component is located at said end of said hinge cover.

4. The refrigerator according to claim 2, wherein said hinge cover comprises a base wall substantially parallel to a top surface of said door and a flange connected to said base wall, and wherein said first component is fixed to said hinge cover along said flange.

5. The refrigerator according to claim 4, wherein said hinge cover is formed with an installation groove provided along said flange, and said first component is fixed in said installation groove.

6. The refrigerator according to claim 2, wherein said first component is co-injection-molded with said hinge cover.

7. The refrigerator according to claim 1, wherein:
    one end of said door, in a height direction, has a side cover;
    a top portion of said side cover has a recess formed therein;
    said second component is disposed in said recess; and
    a cover member is disposed to close said recess.

8. The refrigerator according to claim 7, wherein said second component is fixed to said cover member.

9. The refrigerator according to claim 7, wherein an inner side of said cover member is provided with a positioning portion, and said second component is fixed by said positioning portion.

10. The refrigerator according to claim 7, which further comprises a controller fixed to said door, and wherein said magnetic sensing element is electrically connected to said controller.

11. The refrigerator according to claim 10, wherein said second component is the magnetic sensing element.

12. The refrigerator according to claim 10, wherein said door is formed with an installation pocket configured to accommodate said controller, and wherein said controller is electrically connected to said magnetic sensing element by way of a cable passing through a recess in communication with said installation pocket.

13. The refrigerator according to claim 1, which further comprises:
    a camera device affixed to said door;
    a controller affixed to said door; and
    wherein said magnetic sensing element is mounted to said door and is configured to send a door opening angle signal about a detected opening angle of said door to said controller, and said controller controls an action of said camera device in dependence on the door opening angle signal.

* * * * *